(12) United States Patent
Kono et al.

(10) Patent No.: US 7,427,520 B2
(45) Date of Patent: Sep. 23, 2008

(54) METHOD AND APPARATUS FOR MEASURING THICKNESS OF THIN FILM FORMED ON SUBSTRATE

(75) Inventors: Motohiro Kono, Kyoto (JP); Yoshiyuki Nakazawa, Kyoto (JP); Toshikazu Kitajima, Kyoto (JP)

(73) Assignee: Dainippon Screen Mfg. Co., Ltd., Kyoto (JP)

( * ) Notice: Subject to any disclaimer, the term of this patent is extended or adjusted under 35 U.S.C. 154(b) by 652 days.

(21) Appl. No.: 11/069,996

(22) Filed: Mar. 3, 2005

(65) Prior Publication Data

US 2005/0206911 A1 Sep. 22, 2005

(30) Foreign Application Priority Data

Mar. 16, 2004 (JP) ............................ P2004-073689

(51) Int. Cl.
*H01L 21/66* (2006.01)
(52) U.S. Cl. .............................. 438/14; 438/15; 438/16; 702/97; 702/170
(58) Field of Classification Search ............. 438/14–16; 702/97, 170
See application file for complete search history.

(56) References Cited

U.S. PATENT DOCUMENTS

| | | | |
|---|---|---|---|
| 6,146,541 A | 11/2000 | Goldstein et al. | |
| 6,261,853 B1 | 7/2001 | Howell et al. | |
| 6,303,397 B1 | 10/2001 | Chen et al. | |
| 6,325,078 B2 | 12/2001 | Kamieniecki | |
| 6,519,045 B2 | 2/2003 | Kwon | |
| 2002/0102748 A1 | 8/2002 | Kwon | |
| 2003/0160972 A1 | 8/2003 | Chen et al. | |

FOREIGN PATENT DOCUMENTS

| | | |
|---|---|---|
| JP | 11-297689 | 10/1999 |
| JP | 2002-93871 | 3/2002 |

*Primary Examiner*—Tom Thomas
*Assistant Examiner*—Chakila Tillie
(74) *Attorney, Agent, or Firm*—McDermott Will & Emery LLP

(57) ABSTRACT

A memory (43) of a control unit (4) stores correction data (81) indicating a relationship between a decrement in a measurement value of a film thickness by removal of organic contamination adsorbed onto a substrate and an amount of adsorbed organic contamination corresponding to a difference between a true film thickness and the measurement. The difference is caused by organic contamination adsorbed onto the substrate before removal of organic contamination. In a film-thickness measuring apparatus (1), a calculating/measuring part 41 obtains a first measurement value of a film thickness on a substrate (9) using an ellipsometer (23), and further obtains a second measurement value which is affected by remaining organic contamination after organic contamination adsorbed onto the substrate (9) is removed by an organic contamination remover (3). A film-thickness calculator (42) obtains an amount of adsorbed organic contamination before removal of organic contamination based on the first and second measurement values and the correction data (81). A thickness of the thin film formed on the substrate (9) is accurately obtained based on the first measurement value and the amount of adsorbed organic contamination before removal of organic contamination.

8 Claims, 6 Drawing Sheets

METHOD AND APPARATUS FOR MEASURING THICKNESS OF THIN FILM FORMED ON SUBSTRATE

BACKGROUND OF THE INVENTION

1. Field of the Invention

The present invention relates to a technique for measuring a thickness of a thin film formed on a substrate.

2. Description of the Background Art

In recent years, as a circuit pattern of a semiconductor product has become finer based on a scaling law, a thickness of a film formed on a semiconductor substrate (which will hereinafter be referred to as a "substrate") in semiconductor manufacturing processes has become smaller. It is expected that a film thickness of silicon oxide ($SiO_2$) serving as a gate insulator is equal to or smaller than 1 nm for 65-nm technology node (i.e., a node length), for example, in the future.

On the other hand, it is well known that an optical measurement value of a film thickness is increased due to exposure of a substrate to an atmospheric air in a clean room or storage in a substrate container. This phenomenon is considered to be caused due to adsorption of organic contamination which is produced due to gas released from a plastic material or the like, onto a surface of the substrate. For example, it was confirmed that in a case where a substrate on which a film of silicon oxide with a thickness of 9.2 nm (p-type silicon (Si) substrate) is formed is stored in a substrate container for ten days, the thickness as measured after the storage is increased by approximately 0.2 nm. As such, as a film is becoming further thinner, increase in the thickness due to organic contamination shall more significantly affect process control of semiconductor manufacturing processes. It is additionally noted that though to employ a material which releases little gas as a substrate container for storing a substrate, or to provide a chemical filter, might be of some help to suppression of adsorption of organic contamination onto the substrate, it is difficult to completely eliminate released gas by the foregoing solutions.

Thus, suggested is a method of heating a substrate to remove adsorbed organic contamination prior to measuring a thickness of a film on the substrate, in order to accurately measure the thickness of the film. For example, the specification of U.S. Pat. No. 6,261,853 (which will be hereinafter referred to as "Reference I") discloses a method in which organic contamination is removed from a substrate by heating the substrate in a heating chamber, the substrate is cooled in a cooling chamber which is thermally separated from the heating chamber, and a thickness of a film on the substrate is measured. Also, the specification of U.S. Pat. No. 6,519,045 (which will be hereinafter referred to as "Reference II") discloses a method in which a difference between values of thickness which are measured (measurement value) before and after heating a substrate is previously calculated as a correction value, and the correction value is subtracted from a measurement value of a different substrate without heating the different substrate, to employ the resultant value as a true film thickness. However, as shown in A. Danel and four other persons, "Dry Cleaning of Organic Contamination on Silicon Wafers Using Rapid Optical Surface Treatment" (Switzerland), published by Scitec Publications, Solid State Phenomena, Vols. 76-77, 2001, pp. 59-62, it was confirmed that organic contamination cannot be completely removed by heating a substrate. Further, there is another known method for removing organic contamination, which utilizes ultraviolet rays or ozone. However, this method has the possibility of deteriorating a film formed on a substrate.

In view of the above-mentioned fact described by A. Danel et al., it can be considered that accurate measurement of a thickness of a thin film cannot be achieved only by measuring a thickness of thin film on a substrate after heating the substrate as in the method disclosed by Reference I, because of influences of organic contamination remaining on the substrate. Also, in the method disclosed by Reference II, influences of organic contamination remaining on a substrate after the substrate is heated are not taken into account the correction value. Further, it was confirmed that an amount of adsorbed organic contamination varies depending on each portion of one substrate or on each of substrates stored in one substrate container accommodating the substrates. As such, it is impossible to accurately obtain a thickness of a thin film on a substrate by the method disclosed in Reference II.

SUMMARY OF THE INVENTION

The present invention is directed to a method for measuring a thickness of a thin film formed on a substrate, and it is an object of the present invention to accurately measure the thickness of the thin film.

A method according to the present invention comprises: a correction-data preparing step of preparing correction data indicating a relationship between a decrement in a measurement value of a thickness by removal of organic contamination adsorbed onto a substrate and an amount of adsorbed organic contamination corresponding to a difference between a true film thickness and a measurement value, the difference being caused due to organic contamination adsorbed onto the substrate before or after the removal of organic contamination; a first film-thickness measuring step of obtaining a first measurement value of a film thickness on a substrate before removal of organic contamination; a removing step of performing the removal of organic contamination on the substrate; a second film-thickness measuring step of obtaining a second measurement value of a film thickness on the substrate after the removal of organic contamination; an amount calculating step of obtaining an amount of adsorbed organic contamination before or after the removal of organic contamination, based on a difference between the first measurement value and the second measurement value and the correction data; and a film-thickness obtaining step of obtaining a thickness of a thin film formed on the substrate, based on the first measurement value and an amount of adsorbed organic contamination before the removal of organic contamination, or based on the second measurement value and an amount of adsorbed organic contamination after the removal of organic contamination.

The foregoing method makes it possible to accurately measure a thickness of a thin film formed on a substrate based on the decrement in a measurement value of a film thickness which is decreased by removal of organic contamination.

Preferably, the relationship between the decrement and the amount of adsorbed organic contamination is linear in the correction data.

According to one aspect of the foregoing method, the substrate is heated in the removal of organic contamination, and the substrate is cooled after being heated. As a result, it is possible to rapidly obtain a thickness of a thin film. Also, further preferably, the second film-thickness measuring step is performed after a predetermined time period passes after the removing step. This makes it possible to further accurately measure a film thickness.

According to another aspect of the foregoing method, the thickness of the thin film is measured using light received from the substrate in each of the first film-thickness measuring step and the second film-thickness measuring step. More specifically, the thickness of the thin film is measured using an ellipsometer.

The present invention is also directed to an apparatus for measuring a thickness of a thin film formed on a substrate. The apparatus comprises: an organic contamination remover for performing removal of organic contamination adsorbed onto a substrate; a film-thickness measuring part for obtaining a first measurement value of a film thickness on a substrate before the removal of organic contamination performed by the organic contamination remover, and obtaining a second measurement value of a film thickness of the substrate after the removal of organic contamination; a memory for storing correction data indicating a relationship between a decrement in a measurement value of a film thickness by removal of organic contamination adsorbed onto a substrate and an amount of adsorbed organic contamination corresponding to a difference between a true film thickness and a measurement value, the difference being caused due to organic contamination adsorbed before or after the removal of organic contamination; and a film-thickness calculator for obtaining a thickness of a thin film formed on the substrate using the first measurement value, the second measurement value, and the correction data.

The foregoing apparatus also makes it possible to accurately obtain a thickness of a thin film formed on a substrate based on the decrement in a measurement value of a film thickness which is decreased by removal of organic contamination.

According to one aspect of the foregoing apparatus, the organic contamination remover comprises a hot plate and a cooling plate for cooling a substrate heated by the hot plate. Preferably, the film-thickness calculator is an ellipsometer.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
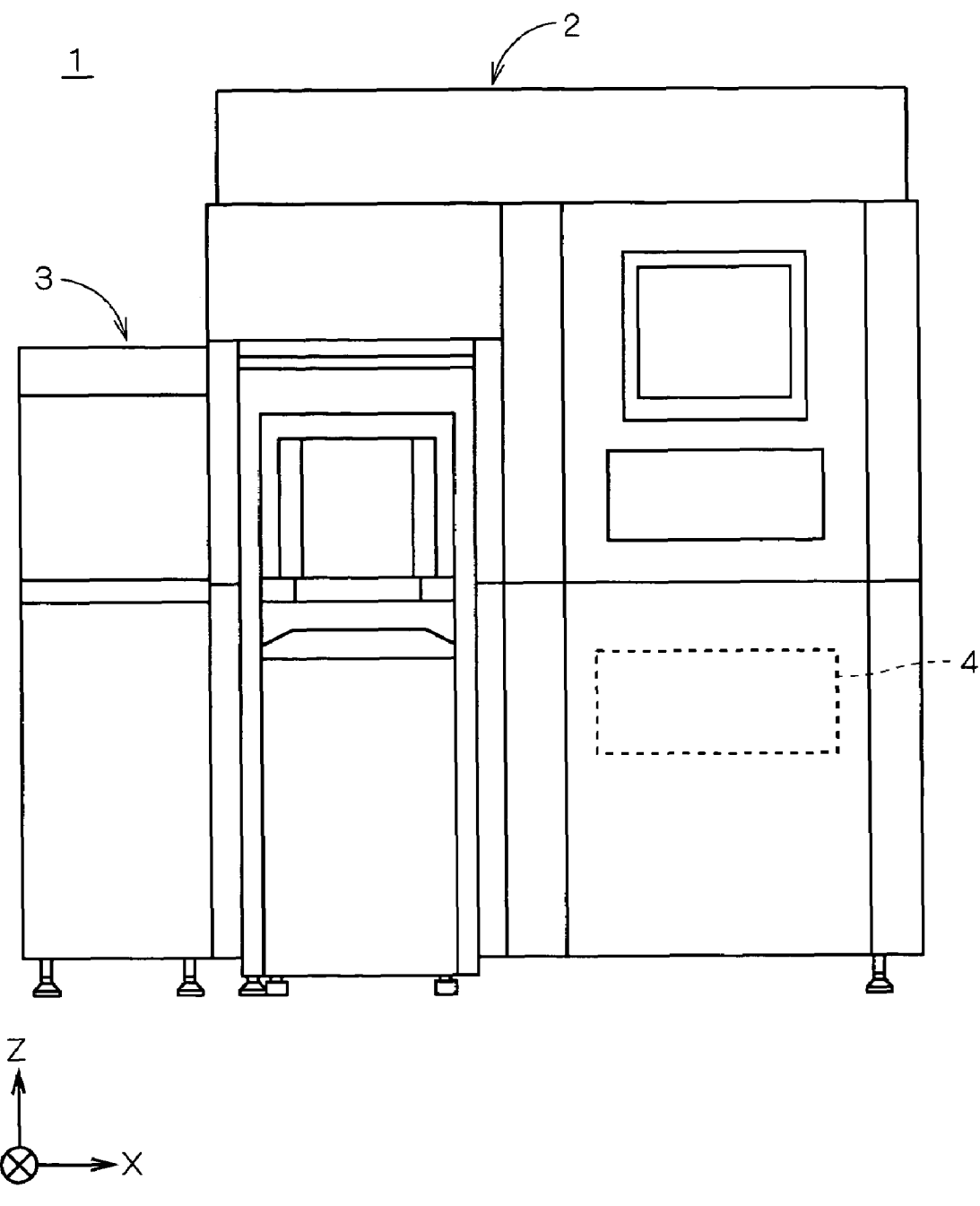
FIG. 1 is a front view of a film-thickness measuring apparatus.

FIG. 1 is a front view of a film-thickness measuring apparatus 1 according to one preferred embodiment of the present invention. As illustrated in FIG. 1, a body 2 of the film-thickness measuring apparatus 1 is provided with an organic contamination remover 3 for removing (or desorbing) organic contamination adsorbed onto (or adhering to), a substrate. Also, a control unit 4 allocated to overall control of the film-thickness measuring apparatus 1 is provided under the body 2. In the film-thickness measuring apparatus 1, a thickness of a thin film (or thin films) (an oxide film, for example) formed on a substrate is measured by constituent elements in the body 2 after organic contamination adsorbed onto the substrate is removed by the organic contamination remover 3. Below, the body 2 and the organic contamination remover 3 will be described in detail.

Figure 2:
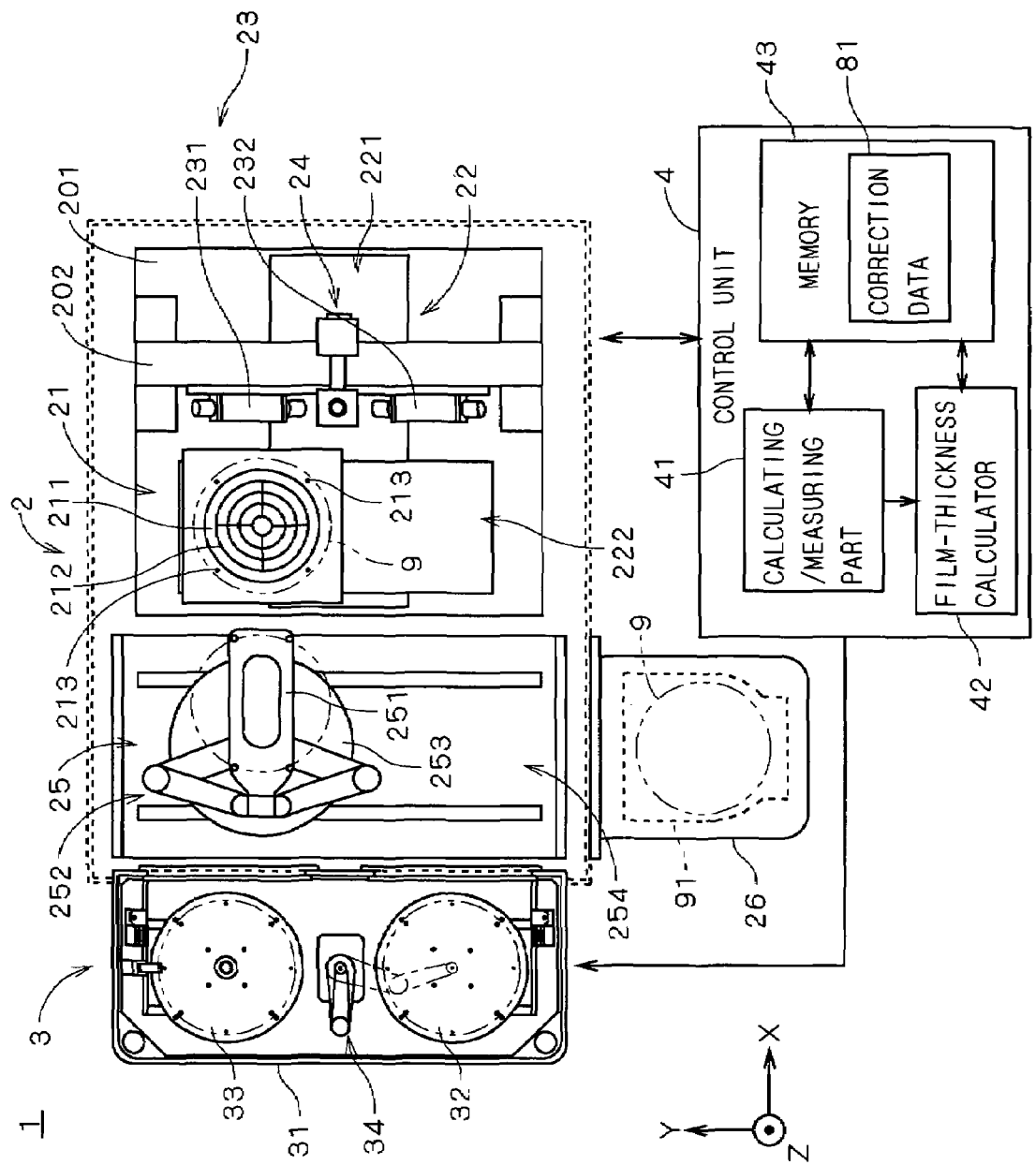
FIGS. 2, 3, and 4 illustrate an internal structure of the film-thickness measuring apparatus.

FIG. 2 illustrates an internal structure of the film-thickness measuring apparatus 1. It is noted that hatching lines for a sectional view of a chamber body 31 of the organic contamination remover 3 which will be later described are omitted in FIG. 2.

On a surface plate 201 provided in the body 2, a stage 21 for holding a substrate 9 and a stage moving mechanism 22 for moving the stage 21 in an X direction and a Y direction shown in FIG. 2 are provided. Also, a frame 202 is secured onto the surface plate 201 so as to extend across the stage moving mechanism 22. Further, an ellipsometer 23 for applying a polarized light to the substrate 9 and obtaining a polarized state of a reflected light received from the substrate 9, and an interferometer unit 24 for applying an illumination light to the substrate 9 and obtaining a spectral intensity of a reflected light received from the substrate 9, are attached to the frame 202.

The stage 21 includes a disc-like substrate holder 211 for holding the substrate 9 and a stage turning mechanism (not illustrated) for turning the substrate holder 211. Grooves 212 used for suction of the substrate 9 is formed in a surface of the substrate holder 211. Further, a plurality of lift pins 213 for moving the substrate 9 in a Z direction shown in FIG. 2 are provided outside the substrate holder 211 in the stage 21. The stage moving mechanism 22 includes an X-direction moving mechanism 221 and a Y-direction moving mechanism 222 each including a motor, and the substrate 9 on the stage 21 is moved relative to the ellipsometer 23 and the interferometer unit 24 by the stage moving mechanism 22.

The ellipsometer 23 includes a light source unit 231 for emitting a polarized light toward the substrate 9 and a light receiving unit 232 for receiving a reflected light from the substrate 9 and obtaining a polarized state of the reflected light. The light source unit 231 includes a semiconductor laser (LD) for emitting a light beam and a polarizer serving as a polarization element. A light beam emitted from the semiconductor laser is polarized by the polarizer, and a polarized light is applied to the substrate 9. The light receiving unit 232 includes an analyzer serving as a polarization element. The analyzer rotates around an axis parallel to an optical axis. A reflected light of the polarized light which is received from the substrate 9 is guided to the analyzer which is rotating, and a light transmitted through the analyzer is received by a photodiode. Then, the ellipsometer 23 obtains a polarized state of the reflected light based on an output of the photodiode which is related to a rotation angle of the analyzer. Then, the obtained polarized state is output to the control unit 4. It is additionally noted that a structure of the ellipsometer 23 is not limited to the above-described structure. Alternatively, the polarizer may rotate, for example.

The interferometer unit 24 includes a light source for emitting a white light, which is applied to the surface of the substrate 9 through an optical system. A reflected light received from the substrate 9 is guided to a spectroscope by the optical system. Then, a spectral intensity of the reflected light is obtained, and output to the control unit 4.

The control unit 4 includes a circuit for controlling the body 2 and the organic contamination remover 3, and further includes a measuring/calculating part 41 for obtaining a (uncorrected) measurement value of a thickness of a thin film on the substrate 9 based on the polarized state of the reflected light which is input from the ellipsometer 23 or the spectral intensity of the reflected light which is input from the interferometer unit 24, a film-thickness calculator 42 for correcting the measurement value obtained by the measuring/calculating part 41 and obtaining a true thickness of the thin film on the substrate 9, and a memory 43 for storing correction data 81 which is used by the film-thickness calculator 42 in correcting the measurement value. In the following description, it is assumed that a film thickness is obtained using the ellipsometer 23 which is capable of measuring a smaller film-thickness than the interferometer unit 24. However, a film thickness may alternatively be obtained using the interferometer unit 24 as needed.

In the body 2, a transfer robot 25 is provided between the stage 21 and the organic contamination remover 3. Also, a pod opener 26 for opening and closing a pod 91 (a FOUP (Front-Opening Unified Pod), for example) in which the substrate is housed is provided in the (−Y) direction relative to the transfer robot 25. In the transfer robot 25, a board 251 is attached to an end of an extendable arm 252, and the substrate 9 is to be placed on the board 251. The arm 252 is secured to a turning mechanism 253. The turning mechanism 253 is moved in the Y direction by a moving mechanism 254. The transfer robot 25 has an access to each of the stage 21, the organic contamination remover 3, and the pod opener 26. The pod 91 is opened by the pod opener 26, and then the substrate 9 in the pod 91 is taken out by the transfer robot 25, to be loaded into the film-thickness measuring apparatus 1. Also, after a film thickness of the substrate 9 is measured, the substrate 9 is returned back into the pod 91 by the transfer robot 25, to be unloaded from the film-thickness measuring apparatus 1.

Figure 3:
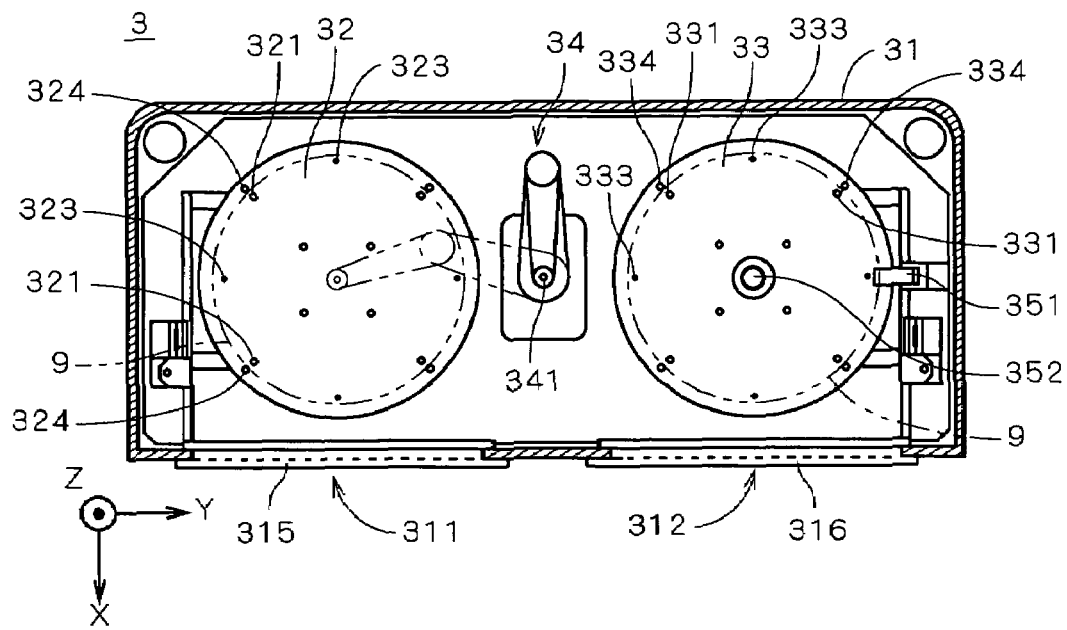

FIG. 3 is a magnified view of the organic contamination remover 3. As illustrated in FIG. 3, the organic contamination remover 3 includes the chamber body 31 which forms a space for processing the substrate 9. In the chamber body 31, a disc-like hot plate 32 for heating the substrate 9 (at a temperature in the range of 200° C. to 420° C.) using a heater provided therein, and a circular thin cooling plate which is made of aluminum and functions to cool the substrate (at a temperature in the range of 10° C. to 40° C., for example), are arranged along the Y direction. Also, a transfer arm 34 for transferring the substrate 9 from the hot plate 32 to the cooling plate 33 is provided between the hot plate 32 and the cooling plate 33. At an end of the transfer arm 34, a chuck 341 for holding the substrate 9 by the sucking force is formed. It is additionally noted that though cooling of the substrate 9 is achieved by placing the substrate 9 on the cooling plate 33 made of aluminum which has a high thermal conductivity in the present preferred embodiment, a water cooling mechanism or an air cooling mechanism may be provided in the cooling plate 33 as needed. Also, the cooling plate 33 may be made of a material other than aluminum.

On a surface of the hot plate 32, a plurality of ceramic balls 323 are arranged at regular intervals along a circle having a diameter which is a little bit smaller than a diameter of a circumference of the substrate 9. Because of provision of the plurality of ceramic balls 323, a small clearance (what is called a "proximity gap") is formed between the substrate 9 placed on the hot plate 32 and the surface of the hot plate 32. Accordingly, it is possible to uniformly heat the substrate 9 and to suppress adhesion of unnecessary substances such as particles to a back surface of the substrate 9 (a main surface facing the hot plate 32). In an analogous manner, a plurality of ceramic balls 333 are provided on the cooling plate 33. Accordingly, it is possible to uniformly cool the substrate 9 and to suppress adhesion of particles or the like to the back surface of the substrate 9. Further, a plurality of guiding members 324 and a plurality of guiding members 334 each for preventing shift of the substrate 9 are provided in the hot plate 32 and the cooling plate 33, respectively.

Figure 4:
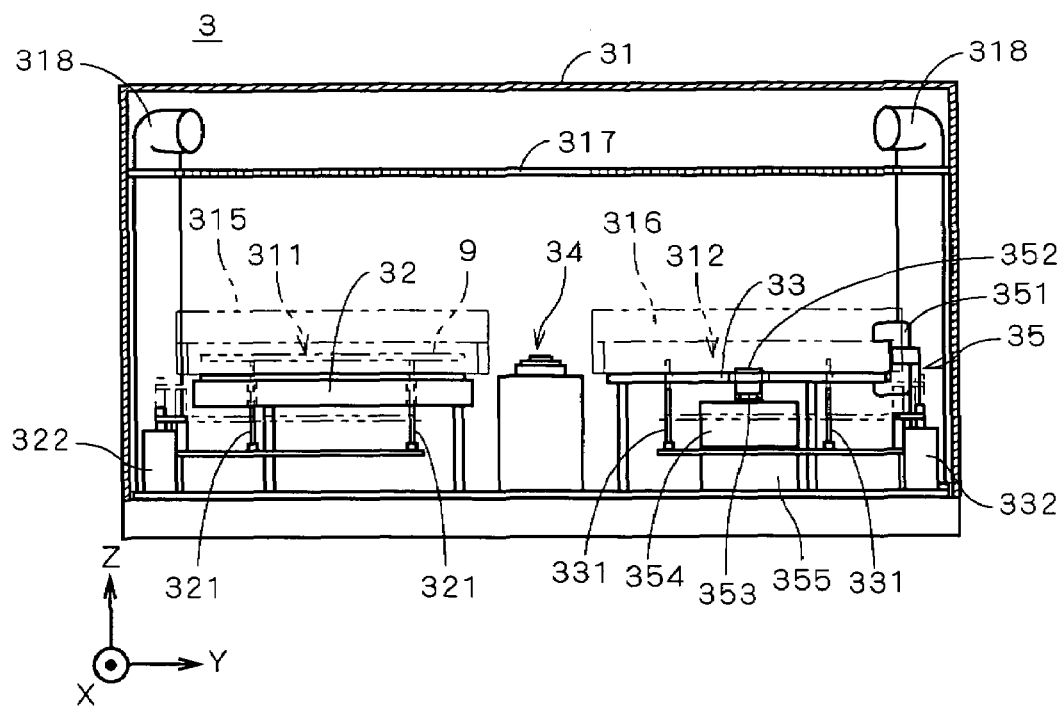

FIG. 4 illustrates an internal structure of the organic contamination remover 3 when viewed from the (+X) side to the (−X) direction. It is noted that FIG. 4 illustrates a state in which a portion of the chamber body 31 which is close to the body 2 is taken out.

As illustrated in FIG. 4, the hot plate 32 and the cooling plate 33 each in a horizontal state are arranged at substantially the same level. A pin moving mechanism 322 connected to a plurality of lift pins 321 and including a cylinder are provided in the vicinity of the hot plate 32. The plurality of lift pins 321 are moved in the Z direction by the pin moving mechanism 322. In the hot plate 32, a plurality of through holes are formed in positions respectively facing the plurality of lift pins 321. Then, the substrate 9 on the hot plate 32 is moved in the Z direction by the plurality of lift pins 321. Also, a plurality of lift pins 331 and a pin moving mechanism 332 including a cylinder are provided in the vicinity of the cooling plate 33, and the plurality of lift pins 331 are moved in the Z direction by the pin moving mechanism 332 in the same manner as described above regarding the hot plate 32. Further, in the cooling plate 33, a plurality of through holes are formed in positions facing the plurality of lift pins 331, and the substrate 9 on the cooling plate 33 are lifted up by the plurality of lift pins 331.

The cooling plate 33 is further provided with a centering unit 35 for adjusting a location of the substrate 9. The centering unit 35 includes an edge detection sensor 351 for detecting a location of an edge of the substrate 9, a chuck 352 for holding the substrate 9 by vacuum, a turning mechanism 353 for turning the chuck 352, an elevating mechanism 354 for moving upward and downward the chuck 352, and a slightly-moving mechanism 355 for slightly moving the chuck 352 in the X direction and the Y direction. In the cooling plate 33, the chuck 352 turns while holding the substrate 9, so that an edge and a notch (or an orientation flat) of the substrate 9 are detected by the edge detection sensor 351. As a result, a location of a center of the substrate 9 and an orientation of the notch of the substrate 9 are specified, and the slightly-moving mechanism 355 and the turning mechanism 353 are controlled such that the substrate 9 is centered and the notch is oriented in a predetermine direction.

In a (+X) part of the chamber body 31 (closer to the body 2) relative to the other parts (which will be hereinafter referred to as "(+X) side"), two openings 311 and 312 arranged along the Y direction are provided (the openings 311 and 322 are indicated by double-dashed lines in FIG. 4). The opening 311 located in the (−Y) direction relative to the opening 312 is formed in the vicinity of the hot plate 32, and the substrate 9 passes through the opening 311 when the substrate 9 is transferred to the hot plate 32 by the transfer robot 25 (see FIG. 2). The opening 312 located in the (+Y) direction relative to the opening 311 is formed in the vicinity of the cooling plate 33, and the substrate 9 passes through the opening 312 when the substrate 9 is transferred from the cooling plate 33.

Further, two shutters (not illustrated) for opening and closing the openings 311 and 312, respectively, are provided in the chamber body 31. The two shutters operate in synchronization with the pin moving mechanism 322 and 332, respectively. Specifically, when the pin moving mechanism 322 moves upward the lift pins 321, the opening 311 is opened. On the other hand, when the pin moving mechanism 332 moves upward the lift pins 331, the opening 312 is opened. However, the shutters are not necessarily required to operate in synchronization with the pin moving mechanism 322 and 332. It is sufficient that the shutters open the openings 311 and 321 with suitable timings.

Moreover, in the chamber body 31, nozzles 315 and 316 each including a slit nozzle for ejecting downward predetermined gas (nitrogen gas, or a clean air, for example) are provided above the openings 311 and 312, respectively (in other words, on the (+Z) sides of the openings 311 and 312, respectively). Each of the nozzles 315 and 316 purges an interior of the chamber body 31 using the predetermined gas to keep the interior of the chamber body 31 clean. Also, since the nozzles 315 and 316 eject the gas near peripheries of the openings 311 and 312 along a surface in which the openings 311 and 312 are formed, respectively, the nozzles 315 and 316 also function as air curtains for preventing an external air from flowing into the chamber body 31 while openings 311 and 312 are opened. As a result, external organic contamination is prevented from entering into the chamber body 31 at the time of transferring the substrate 9 to and from the chamber body 31, to thereby prevent reduction of cleanness within the chamber body 31. Additionally, further nozzles for ejecting upward gas may be provided under the openings 311 and 312, respectively. Also, a gas supplier for purging an interior of the chamber body 31 may be additionally provided in the organic contamination remover 3. In this case, it is preferable to attach the gas supplier so as to allow gas to flow from the cooling plate 33 to the hot plate 32, because to do so prevents reduction of an efficiency in cooling the substrate 9 in the cooling plate 33, which is likely to reduce due to heat of the hot plate 32.

As illustrated in FIG. 4, an upper cover 317 including a net-like vent is provided in an upper part of the chamber body 31. Gas flowing into a space above the upper cover 317, which is formed between the upper cover 317 and the chamber body 31, is let out by an exhausting mechanism including a pump (not illustrated) and exhaust pipes 318 connected to the pump. As such, gas within the chamber body 31 which is heated by the hot plate 32 is efficiently let out (i.e., exhausted) by the exhausting mechanism, so that increase of a temperature of an ambient air within the chamber body 31 can be prevented. Also, to provide the exhaust pipes 318 above the chamber body 31 can reduce a footprint of the organic contamination remover 3.

Figure 5:
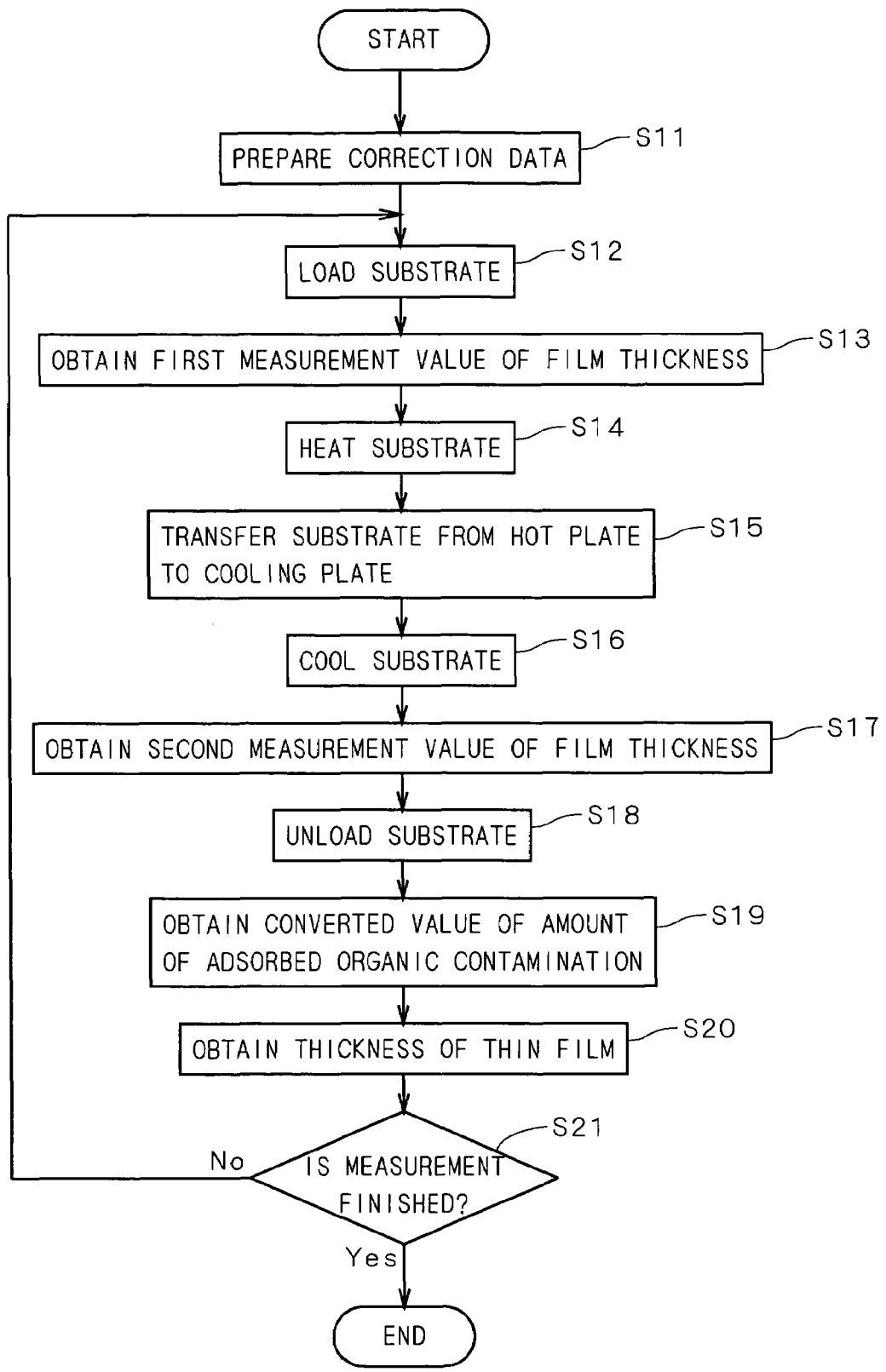
FIG. 5 is a flow chart illustrating operations for removing organic contamination and measuring a thickness of a thin film on a substrate.

FIG. 5 is a flow chart illustrating operations of the film-thickness measuring apparatus 1 for removing organic contamination adsorbed onto the substrate 9 and measuring a thickness of a thin film on the substrate 9 from which the organic contamination has been removed. In the film-thickness measuring apparatus 1, first, the correction data 81 is prepared in accordance with a composition of films (or a film) formed on the substrate 9 as a target of measurement (step S11).

Figure 6:
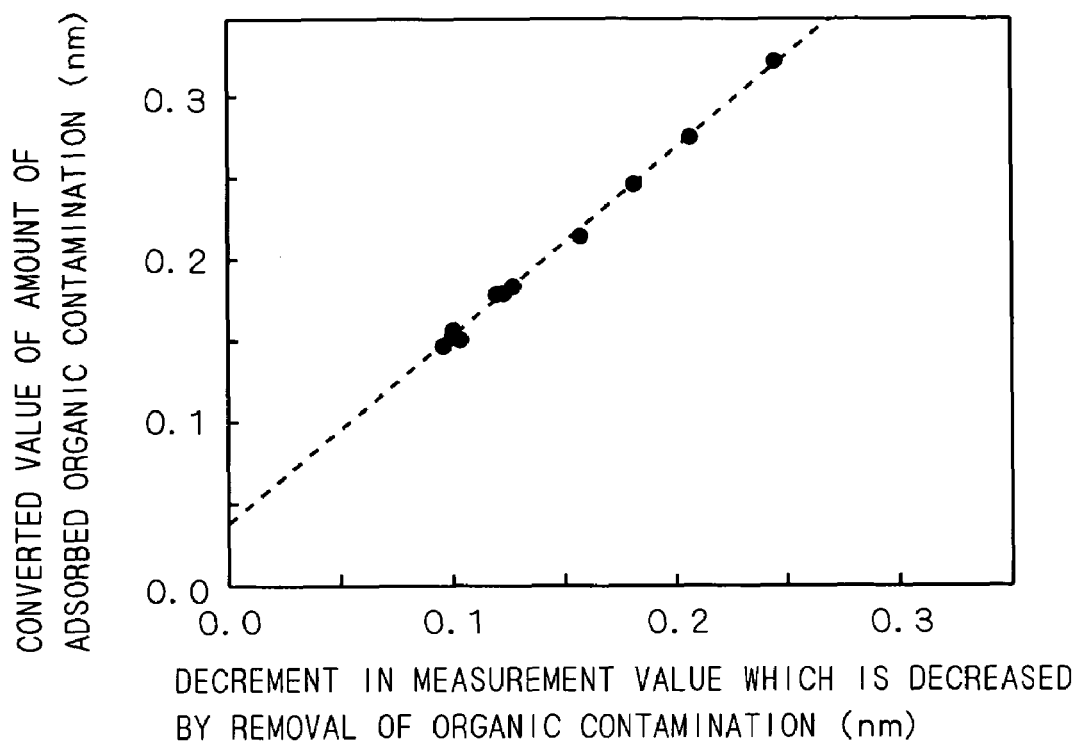
FIG. 6 is a graph showing contents of correction data.

FIG. 6 illustrates contents of the correction data 81. The correction data 81 indicates a relationship between a decrement in a measurement value of a film thickness on a substrate by removal of organic contamination described later and a converted value of amount of adsorbed organic contamination before removal of organic contamination. The converted value is obtained by converting the amount of adsorbed organic contamination to a value corresponding to a film thickness conforming with a composition of films (or a film) on a substrate (which will be hereinafter referred to as a "converted value of amount of adsorbed organic contamination). As illustrated in FIG. 6, the relationship between the decrement in the measurement value and the converted value of amount of adsorbed organic contamination is linear.

Assuming that the decrement in the measurement value is "x" and the converted value of amount of adsorbed organic contamination is "y", the correction data 81 can be expressed by "y=1.154x+0.0032", for example. Details of processes for obtaining the correction data 81 will be given after description of overall operations.

After the correction data 81 is prepared, the pod 91 placed in the pod opener 26 illustrated in FIG. 2 is opened, and then, one of the substrates 9 which are prepared as targets of measurement and include respective films (or a film) having the same composition is loaded into the film-thickness measuring apparatus 1 (step S12). The substrate 9 loaded into the film-thickness measuring apparatus 1 is moved to a position facing the opening 312 in the chamber body 31 illustrated in FIG. 3 by the transfer robot 25. Subsequently, the shutter is opened in synchronization with upward movement of the plurality of lift pins 331, and also, the arm 252 extends in the (−X) direction so that the substrate 9 on the board 251 is transferred into the chamber body 31. When the substrate 9 is placed above the cooling plate 33, the plurality of lift pins 331 move further upward, so that the substrate 9 is held by the lift pins 331. After the board 251 is withdrawn, the lift pins 331 move downward so that the substrate 9 is held by the chuck 352. Subsequently, the substrate 9 is turned, to allow the edge detection sensor 351 to detect the edge of the substrate 9. In this manner, the substrate 9 is centered and an orientation of the notch of the substrate 9 is adjusted. After the location of the substrate 9 is adjusted, the substrate 9 is again lifted up by the lift pins 331 and is transferred from the chamber body 31 by the transfer robot 25. Then, the substrate 9 is held by the plurality of lift pins 213 of the stage 21 illustrated in FIG. 2, and thereafter is held by the substrate holder 211 as a result of downward movement of the lift pins 213.

The substrate 9 is shifted by the stage moving mechanism 22, and a predetermined measuring point on the substrate 9 is aligned with a position to which a polarized light is applied by the ellipsometer 23. For the alignment at that time, since the location and the orientation of the substrate 9 are previously adjusted by the centering unit 35, the substrate 9 can be accurately aligned with the ellipsometer 23. Thereafter, the ellipsometer 23 applies a polarized light to the substrate 9, and a reflected light is received from the substrate 9. Then, a polarized state of the reflected light is obtained. The polarized state of the reflected light is output to the measuring/calculating part 41, and a measurement value of a film thickness at the measuring point on the substrate 9 (which will be hereinafter referred to as a "first measurement value") is obtained (step S13). As is made clear from the above description, the ellipsometer 23 and the measuring/calculating part 41 form a film-thickness measuring part for measuring a thickness of a film on the substrate 9 in the film-thickness measuring apparatus 1.

Actually, a plurality of measuring points are set up on the substrate 9. After a first measurement value at one of the measuring points is obtained, the next measuring point is aligned with the position to which the polarized light is applied by the ellipsometer 23 and another first measurement value at the next measuring point is obtained. Then, this process is repeated, so that a first measurement value at each of the measuring points is obtained in the step S13. It is additionally noted that alignment of the substrate 9 may be achieved based on an image captured by an image capturing part which is additionally provided in the interferometer unit 24, which increases the accuracy in the alignment.

After first measurement values at all the measuring points on the substrate 9 are obtained, the substrate 9 is taken out from the stage 21 by the transfer robot 25, and is moved to a position facing the opening 311 on the (−Y) side of the chamber body 31. Subsequently, the shutter is opened, and the substrate 9 is moved to a position above the hot plate 32 through the opening 311. Then, substrate 9 is placed on the hot plate 32 by the plurality of lift pins 321. While the substrate 9 is being placed on the hot plate 32, the back surface of the substrate 9 is heated at a predetermined temperature for a predetermined time period (at 340° C. for three minutes, for example), to remove organic contamination adsorbed onto the substrate 9 (step S14). After being removed from the substrate 9, the organic contamination, together with an ambient gas, is let out from the exhaust pipes 318. As a result, the interior of the chamber body 31 is kept clean, and re-adsorption of organic contamination onto the substrate 9 is suppressed.

After the substrate 9 is heated, the substrate 9 is moved upward by the plurality of lift pins 321, and the chuck 341 of the transfer arm 34 is placed below the substrate 9. Subsequently, the lift pins 321 move downward, so that the substrate 9 is held by the chuck 341. Then, the transfer arm 34 moves the substrate 9 to a position above the cooling plate 33, where the plurality of lift pins 331 lift up the substrate 9. After the chuck 341 is withdrawn, the lift pins 331 move downward, so that the substrate 9 is placed on the cooling plate 33 (step S15). As is made clear from the above description, a transfer path of the substrate 9 from the hot plate 32 to the cooling plate 33 is included within the chamber body 31 in the organic contamination remover 3. Accordingly, re-adsorption of organic contamination onto the substrate 9 during movement of the substrate 9 is suppressed. Also, the transfer arm 34 for transferring the substrate 9 is included in the chamber body 31. This makes it possible to keep the cleanness of the interior of the chamber body 31 constant. Further, the hot plate 32 and the cooling plate 33 each in a horizontal state are arranged side by side along a horizontal direction. This allows the transfer arm 34 to easily transfer the substrate 9 from the hot plate 32 to the cooling plate 33 while preventing the substrate 9 from being unnecessarily moved upward and downward by the lift pins 321 or the lift pins 331.

While the substrate 9 is being placed on the cooling plate 33, the back surface of the substrate 9 which has been heated by the hot plate 32 is cooled for a predetermined time period (step S16). If a thickness of a thin film on the substrate 9 is measured with the substrate 9 being kept at a high temperature, it is impossible to accurately measure the thickness because optical constants of the thin film at such high temperature are different from that at a normal temperature. However, since the substrate 9 is cooled by the cooling plate 33, the thickness of the thin film can be measured accurately and rapidly in a later process.

Then, the chuck 352 moves upward to hold the substrate 9. Further, the chuck 352 turns while holding the substrate 9, to allow the edge detection sensor 351 to detect the edge of the substrate 9. In this manner, the substrate 9 is centered and an orientation of the notch of the substrate 9 is adjusted. At that time, the location of the substrate 9 is adjusted by the centering unit 35 while the substrate 9 is naturally cooled. As such, operations for measuring the film thickness can be performed efficiently. After the location of the substrate 9 is adjusted, the substrate 9 is lifted up by the lift pins 331 and is transferred from the cooling plate 33 through the opening 312 on the (+Y) side of the chamber body 31 by the transfer robot 25. During transfer from the cooling plate 33, gas having a lower temperature than the substrate 9 is ejected from the nozzle 316 toward the substrate 9 which is passing through the opening 312, to further cool the substrate 9.

After the substrate 9 is heated and cooled for a predetermined time period, the substrate 9 is moved to the stage 21, where one of the plurality of measuring points on the substrate 9 is aligned with a position to which a polarized light is applied by the ellipsometer 23. Thereafter, a polarized state of the reflected light is obtained, and a measurement value of the film thickness at one of the measuring points on the substrate 9 from which organic contamination has been removed (which will be hereinafter referred to as a "second measurement value") is obtained by the measuring/calculating part 41 (step S17). In other words, a film thickness on the substrate 9 after a predetermined time period passes after organic contamination is removed by the organic contamination remover 3 is measured by the ellipsometer 23 and the measuring/calculating part 41.

Then, second measurement values at the other measuring points are obtained in the same manner as described above, so that the second measurement value at each of the plurality of measuring points is obtained. At that time, since the substrate 9 is placed on the stage 21 with the substrate 9 being centered and the orientation of the notch being adjusted, a time period required for alignment of the measuring points in the stage 21 can be shortened. This suppresses re-adsorption of organic contamination to the substrate 9 during a time period from a time when the substrate 9 is transferred from the chamber body 31 to a time when the second measurement value at each of the measuring points is obtained.

After the second measuring points at all the measuring points are obtained, the substrate 9 is taken out from the stage 21 by the transfer robot 25, and returned to the pod 91. In this manner, the substrate 9 is unloaded from the film-thickness measuring apparatus 1 (step S18).

The film-thickness calculator 42 calculates the converted value of amount of adsorbed organic contamination before removal of organic contamination, based on a difference between the first and second measurement values at each of the measuring points and the correction data 81 (step S19). More specifically, the film-thickness calculator 42 calculates the decrement x in the measurement value which is the difference between the first and second measurement values, and substitutes the decrement x into a linear equation (y=1.154x+0.0032) of the correction data 81 indicating the relationship between the decrement x in the measurement value and the converted value y of amount of adsorbed organic contamination. As a result, the converted value y of amount of adsorbed organic contamination can be easily obtained. Then, by subtracting the obtained converted value of amount of adsorbed organic contamination from the first measurement value, a thickness of a thin film formed on the substrate (i.e., corrected film thickness) can be obtained (step S20).

Figure 7:
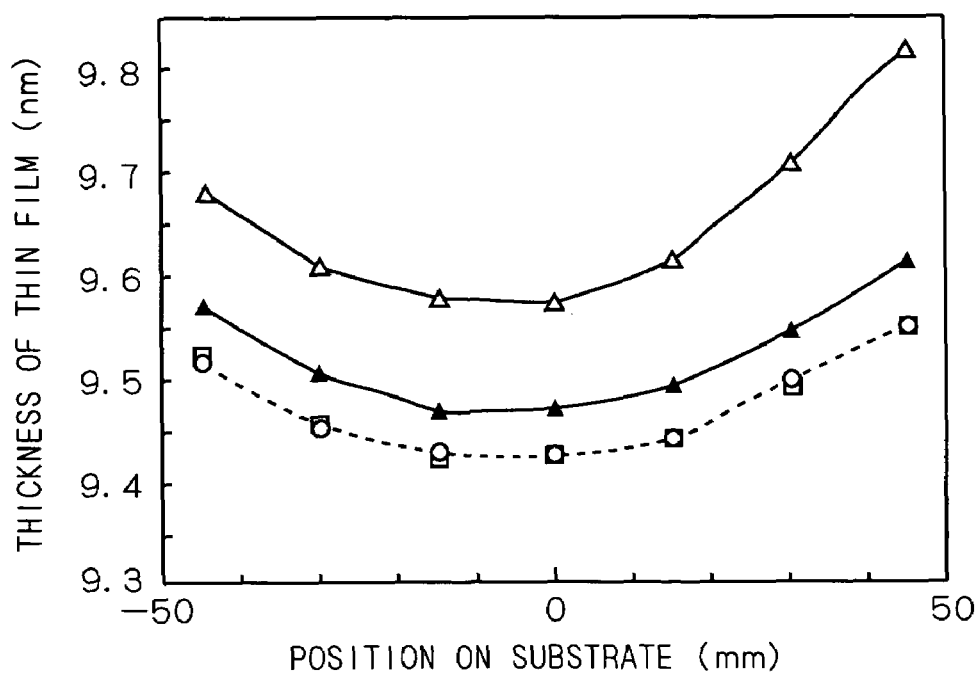
FIG. 7 is a graph showing a thickness of a thin film at each of measuring points on a substrate.

FIG. 7 is a graph showing results of experiments which demonstrate that a thickness of a thin film obtained in the step S20 is highly accurate. In the graph of FIG. 7, a vertical axis represents a thickness of a thin film, and a horizontal axis represents a distance between a center and each of the measuring points on the substrate 9. In the graph of FIG. 7, a white triangle indicates a first measurement value at each of the measuring points, and a black triangle indicates a second measurement value at each of the measuring points. Also, a circle indicates a measurement value of a film thickness at each of the measuring points which is obtained immediately after formation (oxidation) of the thin film on the substrate 9 for experimental purposes. Further, a rectangle indicates a corrected film thickness at each of the measuring points. It is noted that since the measurement value of a film thickness indicated by each circle in FIG. 7 is considered to have been obtained with little organic contamination adsorbed onto the substrate 9, the measurement value indicated by each circle can be regarded as a true thickness of a thin film formed on the substrate 9. It is appreciated from FIG. 7 that a difference between the corrected film thickness indicated by each triangle and each true film thickness is smaller than 0.01 nm, and the corrected film thickness and the true film thickness can be regarded as being substantially identical to each other. This makes it clear that a thickness of a thin film formed on the substrate 9 can be accurately measured by the above-described method.

A corrected film thickness of one of the substrates 9 is obtained, the next one of the substrates 9 which includes a film(s) having the same composition as the film included in the one substrate 9 is prepared as a target of measurement. Then, the steps S12 to S20 are repeated (step S21). It is noted that in the step S14 performed on each of the substrate 9 as targets of measurement, since each of the substrates 9 is heated at a predetermined temperature for a predetermined time period, a thickness of a thin film formed on each of the substrates 9 can be accurately obtained using the same correction data 81. Then, the film-thickness measuring apparatus 1 ends processes with obtainment of a corrected film thickness on each of all the substrates 9 prepared as the targets of measurement (step S21). It is additionally noted that actually, the steps S14 and S16 are performed in parallel on different substrates, respectively, to allow the substrates to be efficiently processed in the organic contamination remover 3.

Next, processes for obtaining the correction data 81 prepared in the step S11 will be described. In obtaining the correction data 81, a film thickness (a true film thickness) is obtained immediately after formation of a thin film, and a plurality of substrates which have been left unattended for different time periods (which will be hereinafter referred to as "reference substrates") are prepared. Then, the above-described steps S12 to S18 are repeated on each of the reference substrates, to obtain the first measurement value and the second measurement value for each of the reference substrates. Each of the reference substrates may include a plurality of measuring points, of course.

Subsequently, by subtracting the first measurement value from the second measurement value for each of the reference substrates, a decrement in the measurement value of a film thickness which is decreased by removal of organic contamination adsorbed onto each of the reference substrates is obtained. Further, by subtracting a true film thickness from the first measurement value, an amount of adsorbed organic contamination (precisely, the converted value of amount of adsorbed organic contamination) corresponding to a difference between the true film thickness and the measurement value is obtained. The difference is caused due to adsorption of organic contamination before removal of organic contamination. Thereafter, a linear equation (linear approximation expression) representing a relationship between a decrement in each measurement value and its corresponding converted value of amount of adsorbed organic contamination is obtained, to thereby obtain the correction data 81. Additionally, in general, a slope and an intercept in the linear equation representing a relationship between the decrement x in the measurement value and the converted value y of amount of adsorbed organic contamination, depend on a temperature and a time period for heating the substrate 9.

As described above, in the organic contamination remover 3 of the film-thickness measuring apparatus 1 illustrated in FIG. 1, the hot plate 32, the cooling plate 33, and the transfer arm 34 are provided within the chamber body 31, and the substrate 9 is transferred from the hot plate 32 to the cooling plate 33 by the transfer arm 34 within the chamber body 31. Accordingly, it is possible to suppress re-adsorption of organic contamination onto the substrate 9 during a time period from a time when organic contamination adsorbed onto the substrate 9 is removed to a time when cooling of the substrate 9 is completed, in the organic contamination remover 3 which is capable of cooling one substrate while heating another substrate. Also, since removal of organic contamination is achieved by heating the substrate 9 in the organic contamination remover 3, it is possible to remove organic contamination without degrading a quality of the substrate 9.

Figure 8:
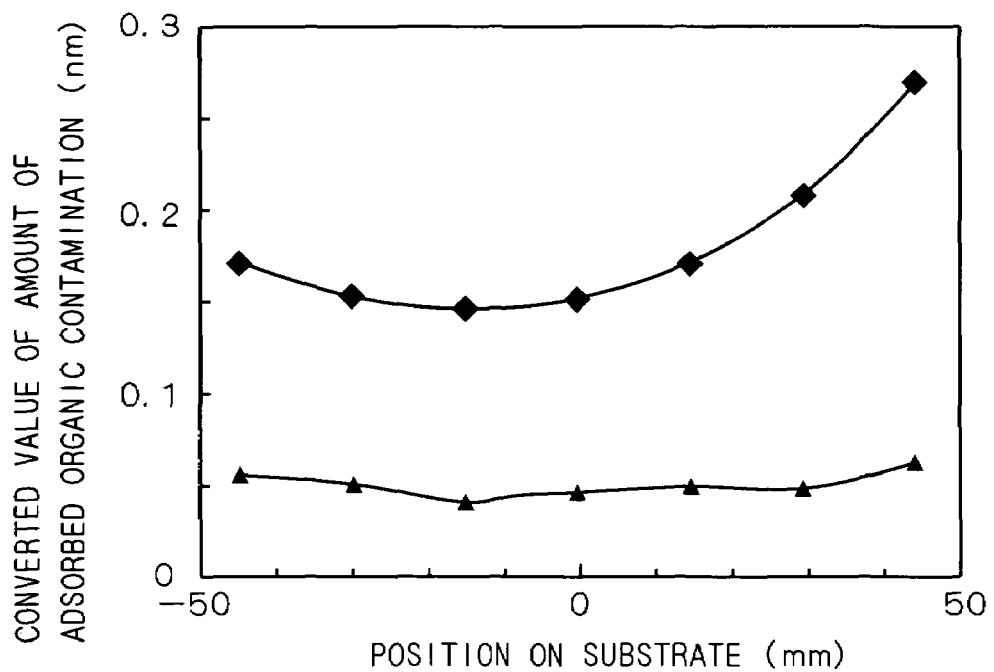
FIG. 8 is a graph showing converted values of amount of adsorbed organic contamination before and after removal of organic contamination.

In the meantime, FIG. 8 is a graph showing converted values of amount of adsorbed organic contamination before and after removal of organic contamination. In the graph of FIG. 8, a rectangle indicates the converted value of amount of adsorbed organic contamination before removal of organic contamination, and a triangle indicates the converted value of adsorbed organic contamination after removal of organic contamination. A horizontal axis in the graph of FIG. 8 represents a distance from a center on a substrate. As shown in FIG. 8, it has been demonstrated by experiments that a commonly-used heat treatment (heating at a temperature of 340° C. for three minutes, for example) cannot make the converted value of amount of adsorbed organic contamination after removal of organic contamination, equal to zero. This is described by the above-cited reference by A. Danel et al., also.

Figure 9:
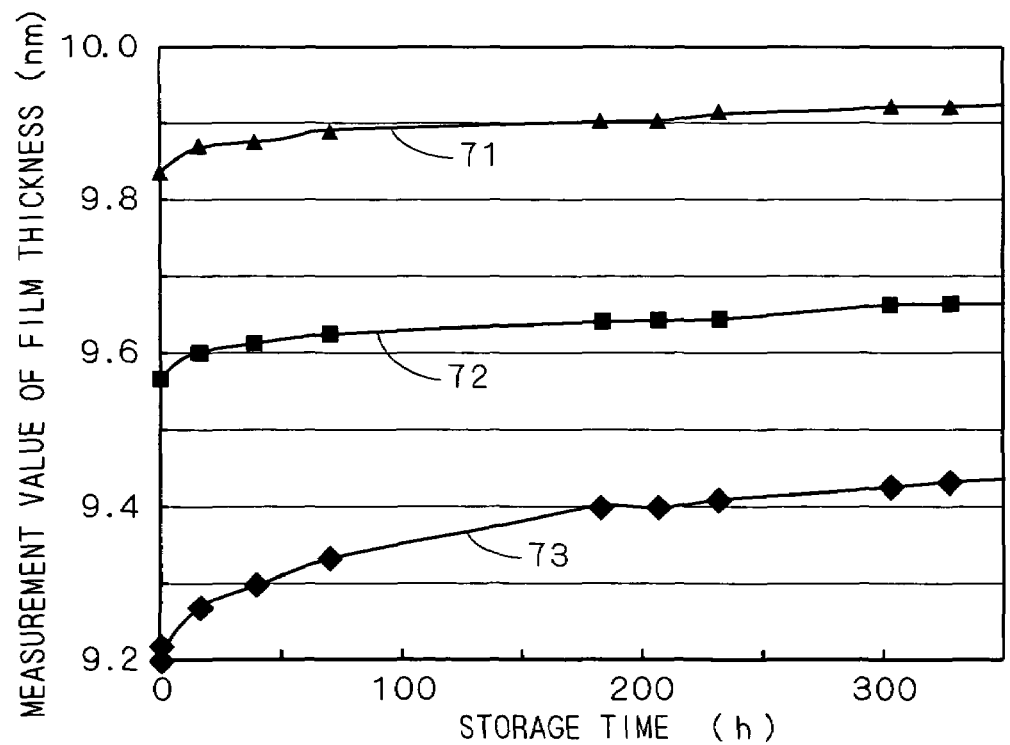
FIG. 9 is a graph showing how measurement values of film thicknesses on substrates stored in one substrate container vary with time.

FIG. 9 is a graph showing how measurement values of film thicknesses on a plurality of substrates stored in one substrate container made of polypropylene (precisely, a plurality of substrates on which oxide films are simultaneously formed) vary with time. In the graph of FIG. 9, lines 71, 72, and 73 represent how measurement values of film thicknesses on substrates placed in different positions in the substrate container vary with time, respectively. In a case represented by each of the lines 71 and 72, a measurement value of a film thickness provided immediately after oxidation is increased by 0.09 nm after 328 hours pass. On the other hand, in a case represented by the line 73, a measurement value of a film thickness provided immediately after oxidation is increased by 0.23 nm after 328 hours pass. It is made clear from FIG. 9 that even if a plurality of substrates are stored in the same substrate container, an increment in the measurement value of a film thickness (i.e., the converted value of amount of adsorbed organic contamination) is different among the substrates. Further, an amount of adsorbed organic contamination varies from position to position in one substrate as shown in FIG. 8. Therefore, it is impossible to accurately measure a thickness of a thin film merely by subtracting a constant value from the measurement value, for example.

In contrast, in the film-thickness measuring apparatus 1, a thickness of a thin film formed on the substrate 9 is obtained using the first measurement value of a film thickness on the substrate 9 which is provided before removal of organic contamination by the organic contamination remover 3, the second measurement value of the film thickness on the substrate which is provided after removal of organic contamination, and the correction data 81 indicating a relationship between a converted value of decreased organic contamination by removal of organic contamination and a converted value of amount of adsorbed organic contamination before removal of organic contamination. As a result, it is possible to accurately obtain a thickness of the thin film on the substrate 9 without being affected by (a non-constant amount of) organic contamination which remains after removal of organic contamination. Also, in the film-thickness measuring apparatus 1, the second measurement value is obtained after a predetermined time period passes after organic contamination is removed. This makes it possible to further accurately obtain a thickness of a thin film using the same correction data 81.

In the step S20, a thickness of a thin film formed on the substrate 9 is obtained based on the first measurement value and an amount of adsorbed organic contamination before removal of organic contamination. Alternatively, a corrected film thickness may be obtained based on the second measurement value and an amount of adsorbed organic contamination after removal of organic contamination. In this alternative embodiment, correction data indicating a relationship between a decrement in the measurement value of a film thickness by removal of organic contamination and the converted value of adsorbed (i.e., remaining) organic contamination after removal of organic contamination is prepared in the step S11. The converted value corresponds to a difference between a true film thickness and the measurement value which is caused by organic contamination adsorbed onto a substrate after removal of organic contamination. Also, the converted value of adsorbed organic contamination after removal of organic contamination is obtained in the step S19. In this manner, it is possible to accurately obtain a thickness of a thin film.

Hereinbefore, though the preferred embodiment of the present invention has been described, the present invention is not limited to the above-described preferred embodiment, and various modifications are possible.

According to the above-described preferred embodiment, removal of organic contamination adsorbed onto the substrate 9 is accomplished by heating the substrate 9 using the hot plate 32. Alternatively, infrared rays may be applied to the substrate, or a surface of the substrate may be exposed to high-temperature gas, to heat the substrate for removal of organic contamination. Also in this case, it is impossible to completely remove organic contamination adsorbed onto the substrate, and thus a thickness of a thin film on the substrate can be accurately measured by performing calculations based on the measurement values of a film thickness before and after removal of organic contamination and correction data.

Further alternatively, the correction data 81 is not necessarily required to be in the form of an equation. For example, the correction data 81 may be in the form of a look-up table.

The substrate 9 is not limited to a semiconductor substrate. Alternatively, the substrate 9 may be a glass substrate used for a liquid crystal display, a flat panel display, or the like. Further, a thin film formed on a substrate may be an insulating film or the like other than an oxide film.

While the invention has been shown and described in detail, the foregoing description is in all aspects illustrative and not restrictive. It is therefore understood that numerous modifications and variations can be devised without departing from the scope of the invention.

This application claims priority benefit under 35 U.S.C. Section 119 of Japanese Patent Application No. 2004-73689 in the Japanese Patent Office on Mar. 16, 2004, the entire disclosure of which is incorporated herein by reference.

What is claimed is:

1. A method of measuring a thickness of a thin film formed on a substrate, comprising:

a correction-data preparing step of preparing correction data indicating a relationship between a decrement in a measurement value of a thickness by removal of organic contamination adsorbed onto a substrate and an amount of adsorbed organic contamination corresponding to a difference between a true film thickness and a measurement value, said difference being caused due to organic contamination adsorbed onto said substrate before or after said removal of organic contamination;

a first film-thickness measuring step of obtaining a first measurement value of a film thickness on a substrate before removal of organic contamination;

a removing step of performing said removal of organic contamination on said substrate;

a second film-thickness measuring step of obtaining a second measurement value of a film thickness on said substrate after said removal of organic contamination;

an amount calculating step of obtaining an amount of adsorbed organic contamination before or after said removal of organic contamination, based on a difference between said first measurement value and said second measurement value and said correction data; and a film-thickness obtaining step of obtaining a thickness of a thin film formed on said substrate, based on said first measurement value and an amount of adsorbed organic contamination before said removal of organic contamination, or based on said second measurement value and an amount of adsorbed organic contamination after said removal of organic contamination.

2. The method according to claim 1, wherein said relationship between said decrement and said amount of adsorbed organic contamination is linear in said correction data.

3. The method according to claim 1, wherein said substrate is heated in said removal of organic contamination.

4. The method according to claim 3, wherein said removal of organic contamination is performed on each of a plurality of substrates, and each of said plurality of substrates is heated at a predetermined temperature for a predetermined time period in said removal of organic contamination.

5. The method according to claim 3, further comprising a cooling step of cooling said substrate between said removing step and said second film-thickness measuring step.

6. The method according to claim 1, wherein said second film-thickness measuring step is performed after a predetermined time period passes after said removing step.

7. The method according to claim 1, wherein said thickness of said thin film is measured using light received from said substrate in each of said first film-thickness measuring step and said second film-thickness measuring step.

8. The method according to claim 7, wherein said thickness of said thin film is measured using an ellipsometer in each of said first film-thickness measuring step and said second film-thickness measuring step.

* * * * *